United States Patent

[19] Izumikawa

[11] Patent Number: 6,023,430
[45] Date of Patent: Feb. 8, 2000

[54] SEMICONDUCTOR MEMORY DEVICE ASYNCHRONOUSLY COMMUNICABLE WITH EXTERNAL DEVICE AND ASYNCHRONOUS ACCESS CONTROLLER FOR DATA ACCESS

[75] Inventor: Masanori Izumikawa, Tokyo, Japan

[73] Assignee: NEC Corporation, Tokyo, Japan

[21] Appl. No.: 09/212,281

[22] Filed: Dec. 16, 1998

[30] Foreign Application Priority Data

Dec. 17, 1997 [JP] Japan ................................ 9-346933

[51] Int. Cl.[7] ........................................................ G11C 7/00
[52] U.S. Cl. .................... 365/194; 365/191; 365/189.04
[58] Field of Search ................................. 365/233, 239, 365/191, 189.04, 194; 395/285

[56] References Cited

U.S. PATENT DOCUMENTS 5,673,398  9/1997  Takeda ..................................... 395/285

FOREIGN PATENT DOCUMENTS 63-313249  12/1988  Japan .

OTHER PUBLICATIONS

Nanya et al., "Asynchronous Processors—Toward Ultrahigh-Speed VLSI Systems", (partial translation),Information Processing, vol. 34, No. 1, Jan. 1993, p. 76.

Takamura et al., "Performance Enhancement Technologies in Logic Design of Asynchronous Processor TITAC–2", (partial trans.), Papers Elec. Info. Comm. Soc. D–1, vol. J80–D–1, (Mar. 1997), pp. 189–196.

Komori et al., "A 50MFLOPS Superpipelined Data–Driven Microprocessor", 1991 IEEE International Solid State Circuits Conference, pp. 92–93.

Meng et al., "Automatic Synthesis of Asynchrous Circuits from High–Level Specifications", IEEE Transactions on Computer–aided Design, vol. 8, No. 11, (Nov. 1989), pp. 1185–1205.

Williams et al., "A Zero–Overhead Self–Timed 160ns 54b CMOS Divider", 1991 IEEE International Solid State Circuits Conference, pp. 98–99.

Primary Examiner—Vu A. Le
Assistant Examiner—Thong Le
Attorney, Agent, or Firm—Foley & Lardner

[57] ABSTRACT

Data is asynchronously transferred between a semiconductor static random access memory device and an external device equipped with an asynchronous access controller by using an access request signal representative of a request for accessing data bits stored in the semiconductor static random access memory device and an acknowledge signal representative of completion of the data access, and Muller's c-elements are incorporated in the asynchronous access controller for producing the access request signal at more than one timing in each access cycle under the control of two clock signals different in phase from each other.

20 Claims, 14 Drawing Sheets

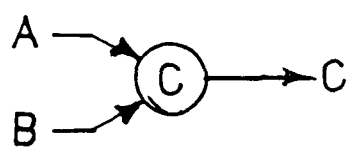
Fig. 10
| A | B | C |
|---|---|---|
| 0 | 0 | 0 |
| 1 | 0 | C |
| 0 | 1 | C |
| 1 | 1 | 1 |
Fig. 11
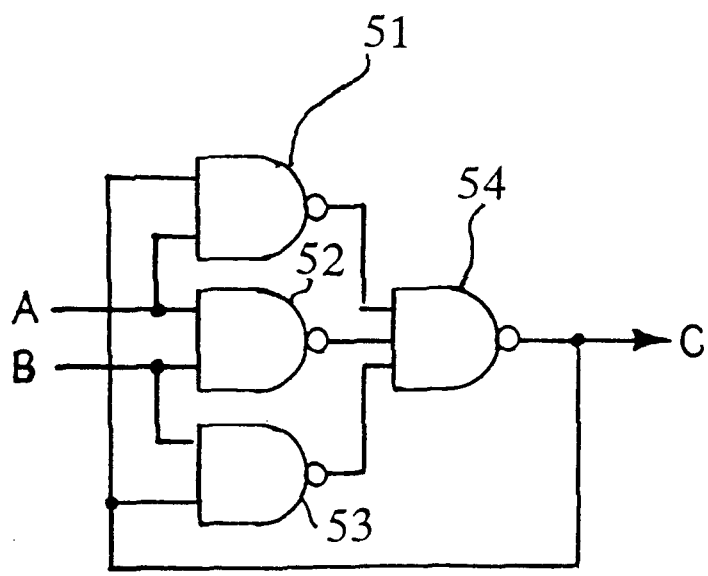
Fig. 12

SEMICONDUCTOR MEMORY DEVICE ASYNCHRONOUSLY COMMUNICABLE WITH EXTERNAL DEVICE AND ASYNCHRONOUS ACCESS CONTROLLER FOR DATA ACCESS

FIELD OF THE INVENTION

This invention relates to a semiconductor memory device and, more particularly, to a semiconductor memory device and an access controller for controlling asynchronous data access to the semiconductor memory device.

DESCRIPTION OF THE RELATED ART

An operation sequentially proceeds in some kinds of semiconductor integrated circuit devices such as a random access memory device, and a timing generator gives appropriate timings to other component units.

FIG. 1 illustrates a sequential activation in a static random access memory device synchronized with a clock signal. An activation cycle T1 is equal to the clock period. A write-in signal starts to rise at time t1. The request for the write-in operation becomes valid at the pulse rise t2 of the clock signal, and a selected word line starts to rise at time t3. Then, the selected word line connects the memory cells of an associated row to bit line pairs. When a data read-out is requested, the static random access memory device traces a similar sequence. A read-out signal starts to rise at time t4, and the request for the data read-out becomes valid at the pulse rise t5 of the clock signal. A word line starts to rise at time t6, and the bit line pairs are connected to the memory cells of the associated row.

FIG. 2 illustrates a timing generator incorporated in a static random access memory device, and the prior art timing generator generates a sense enable signal in synchronized with the clock signal CLK1. The prior art timing generator comprises a two-input OR gate 1, a two-input NAND gate 2, an inverter 3 and a delay circuit 4. The read-out signal RD1 and the write-in signal WR1 are supplied to the two input nodes of the OR gate 1. The clock signal CLK1 is supplied to one of the input nodes of the NAND gate 2, and the output node of the OR gate 1 is connected to the other of the input nodes of the NAND gate 2. The output node of the NAND gate 2 is connected to the input node of the inverter 3, and an internal CLK2 is generated at the output node of the inverter 3. The output node of the inverter 3 is connected to a delay circuit 4, and the delay circuit 4 supplies a sense enable signal SE1 of active high level to sense amplifiers (not shown).

While both of the write-in signal WR1 and the read-out signal RD1 are in the low level, the OR gate 1 fixes an output signal of logic "0" level, and, accordingly, the NAND gate 2 fixes the output signal to logic "1" level. The output signal of logic "1" level is inverted by the inverter. Thus, the internal clock signal CLK2 remains in the low level.

When one of the write-in signal WR1 and the read-out signal RD1 is changed to logic "1" level, the OR gate 1 produces the output signal of logic "1" level. The NAND gate 2 is responsive to the clock signal CLK1, and produces the inverted signal of the internal clock signal CLK1. Thus, the inverter produces the internal clock signal CLK2. Then, the sense enable signal SE1 of active high level is produced at a predetermined timing.

Turning back to FIG. 1, the selection of word lines is synchronous with the pulse rise of the clock signal, and every clock pulse provides only one activation timing. This means that the data write-in and the data read-out are dependent on the frequency of the clock signal, and the clock generator (not shown) sets a limit on the data write-in speed and the data read-out speed.

An asynchronous data access is attractive to the manufacturer in order to accelerate the data access. A handshake is one of the asynchronous data access technologies, and FIG. 3 illustrates the asynchronous data access through the handshake. Assuming now that function blocks are connected through control signal lines and data signal lines, When one function block, which is hereinbelow referred to as "first function block", requests another function block, which is hereinbelow referred to as "second function block" to process data represented by a data signal, the first function block supplies the data signal to the second function block, and changes a request signal for a data processing to an active high level at time t11. The second function block responds to the request signal, and processes the data. Upon completion of the data processing, the second function block sends the result of the data processing to the first function block, and changes an acknowledge signal to the active high level at time t12. When the first function block receives the acknowledge signal, the first function block recovers the request signal to the inactive low level. When the second function block changes the acknowledge signal to the inactive low level, the first function block is allowed to request the second function block to process the next data. In this way, the function blocks communicate with one another through the request signal and the acknowledge signal, and asynchronously transfer the data and the result.

A kind of handshake technology is employed in a memory device disclosed in Japanese Patent Publication of Unexamined Application No. 63-313249. Although a request signal and an acknowledge signal are used for the communication between component units in the prior art memory device, the request signal and the acknowledge signal are still changed in the activation cycle defined by a clock signal, and an asynchronous data access is never carried out by the prior art memory device. In other words, the data write-in and the data write-in start at a predetermined timing in the activation cycles.

SUMMARY OF THE INVENTION

It is therefore an important object of the present invention to provide a semiconductor memory device, which is asynchronously communicable with an external device through a request signal and an acknowledge signal regardless of a clock cycle.

It is also an important object of the present invention to provide an asynchronous access controller, which controls an asynchronous data access to the semiconductor memory device.

In accordance with one aspect of the present invention, there is provided a semiconductor memory device comprising a memory cell array including a plurality of memory cells for storing data bits in a readable manner, respectively, an accessing means responsive to a plurality of internal control signals for allowing an external device to selectively access the data bits and a timing generating means responsive to an access request signal for sequentially generating the plurality of internal control signals without a clock signal and an acknowledge signal at a predetermined timing relating to the generation of one of the internal control signals.

In accordance with another aspect of the present invention, there is provided an asynchronous access controller for generating an access request signal used for an asynchronous data access to a data storing circuit comprising a read request signal generating circuit including a first Muller's c-element supplied with an acknowledge signal from the data storing circuit and a first clock signal and producing a first output signal of a first logic level from the acknowledge signal of the first logic level and the first clock signal of the first logic level and the first output signal of a second logic level opposite to the first logic level from the acknowledge signal of the second logic level and the first clock signal of the second logic level and maintaining the logic level of the first output signal when the acknowledge signal is opposite in logic level from the first clock signal and a first logic circuit responsive to the first output signal of the first logic level and a read-out signal of an active level for generating a read request signal of an active level, a write request signal generating circuit including a second Muller's c-element supplied with the acknowledge signal from the data storing circuit and a second clock signal different in phase from the first clock signal and producing a second output signal of the first logic level from the acknowledge signal of the first logic level and the second clock signal of the first logic level and the second output signal of the second logic level from the acknowledge signal of the second logic level and the second clock signal of the second logic level and maintaining the logic level of the second output signal when the acknowledge signal is opposite in logic level from the second clock signal and a second logic circuit responsive to the second output signal of the first logic level and a write-in signal of an active level for generating a write request signal of an active level, and a third logic circuit responsive to one of the read request signal of the active level and the write request signal of the active level for generating an access request signal of an active level.

BRIEF DESCRIPTION OF THE DRAWINGS

The features and advantages of the semiconductor memory device and the asynchronous access controller will be more clearly understood from the following description taken in conjunction with the accompanying drawings in which:

FIG. 10 is a view showing the graphical symbol of a Muller's c-element;

FIG. 11 is a truth table for the Muller's c-element;

FIG. 12 is a logic diagram showing a circuit configuration of the Muller's c-element;

DESCRIPTION OF THE PREFERRED EMBODIMENTS

Semiconductor Memory Device

First Embodiment

Figure 4:
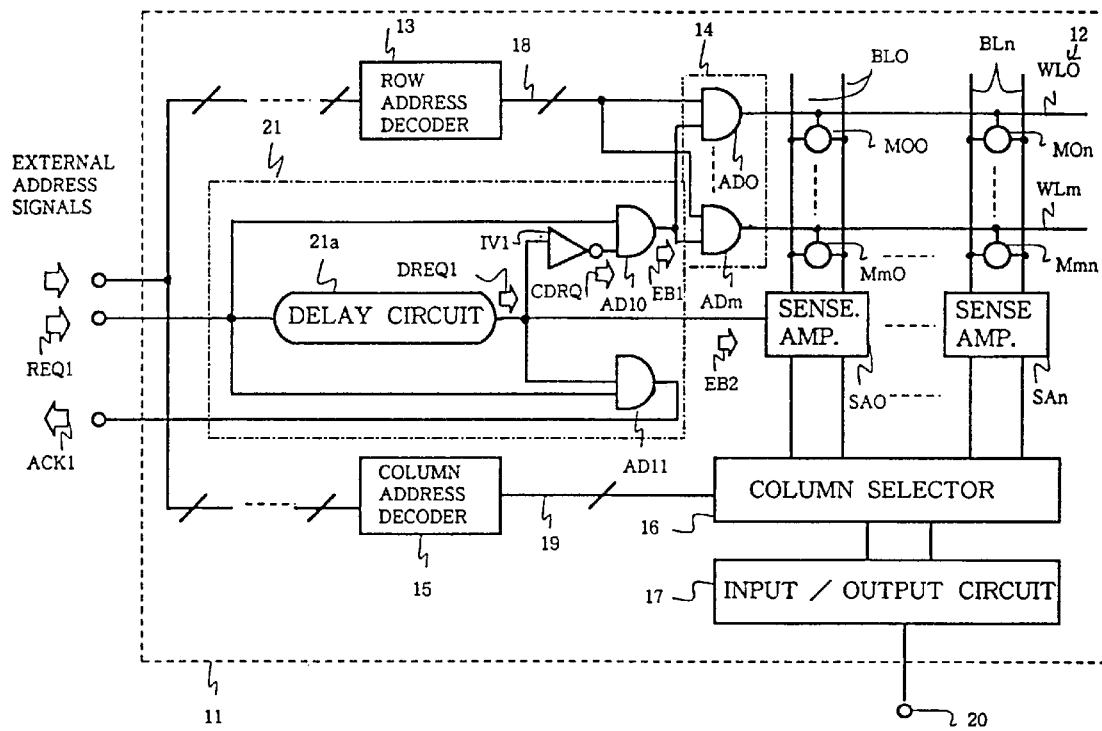
FIG. 4 is a circuit diagram showing a semiconductor static random access memory device according to the present invention.

Referring to FIG. 4 of the drawings, a semiconductor static random access memory device is fabricated on a semiconductor chip 11, and comprises a memory cell array 12, word lines WL0 to WLm and bit line pairs BL0 to BLn. Plural memory cells M00–M0n, . . . . and Mm0–Mmn form the memory cell array 12, and are arranged in rows and columns. The memory cells M00 to Mmn are of a static random access memory cell. The circuit configuration of the static random access memory cell is well known to a person skilled in the art, and no further description is incorporated hereinbelow. The word lines WL0 to WLm are respectively connected to the rows of memory cells M00–M0n, . . . and Mm0–Mmn, and each word line WL0 to WLm makes the associated row of memory cells to be accessible. The bit line pairs BL0 to BLn are respectively connected to the columns of memory cells M00–Mm0, . . . and M0n–Mmn, and propagate data bits from and to a selected row of memory cells.

The semiconductor static random access memory device further comprises a row address decoder 13, a word line driver 14, a column address decoder 15 and a column selector 16. These component units 13, 14, 15 and 16 cooperates with the word lines WL0–WLm and the bit line pairs BL0–BLn, and selectively connects the memory cells M00–Mmn to an input/output circuit 17.

The row address decoder 13 decodes row address signals, and selectively changes row address decoded signal lines 18 to an active level. The word line driver 14 includes plural AND gates AD0–ADm, and the word lines WL0 to WLm are respectively connected to the output nodes of the AND gates AD0–ADm. The row address decoded signal lines 18 are selectively connected to the AND gates AD0 to Adm. The AND gates AD0–ADm are enabled with an enable signal EB1, and the row address decoded signal lines 18 select one of the AND gates AD0 to ADm. The selected AND gate drives the associated word line to the active high level.

The column address decoder 15 decodes column address signals, and selectively changes column selecting lines 19 to the active high level. The column selecting lines 19 are connected to the column selector 16, and the column selector 16 selectively connects the bit line pairs BL0 to BLn to the input/output circuit 17. The input/output circuit 17 is connected to a data port 20.

The semiconductor static random access memory device further comprises a timing generator 21 and sense amplifiers SA0 to SAn. The sense amplifiers SA0 to SAn are respectively connected to the bit line pairs BL0 to BLn, and increase the magnitude of potential differences on the bit line pairs BL0 to BLn, respectively.

The timing generator 21 is responsive to an access request signal REQ1 for producing the enable signals EB1/EB2 and an acknowledge signal ACK1. The timing generator 21 includes AND gates AD10/AD11, an inverter IV1 and a delay circuit 21a. The access request signal REQ1 is directly supplied to an input node of the delay circuit 21a, an input node of the AND gate AD10 and an input node of the AND gate AD11. The delay circuit 21a propagates the access request signal REQ1 from the input node to an output node, and introduces a time delay during the propagation. The sense enable signal EB2 is produced at the output node of the delay circuit 21a, and the sense enable signal EB2 is supplied to the sense amplifiers SA0 to SAn, the inverter IV1 and the other input node of the AND gate AD11. The inverter produces the inverted signal CDRQ of the delayed access request signal DREQ1, and supplies the inverted signal CDRQ to the other input node of the AND gate AD10.

Figure 5:
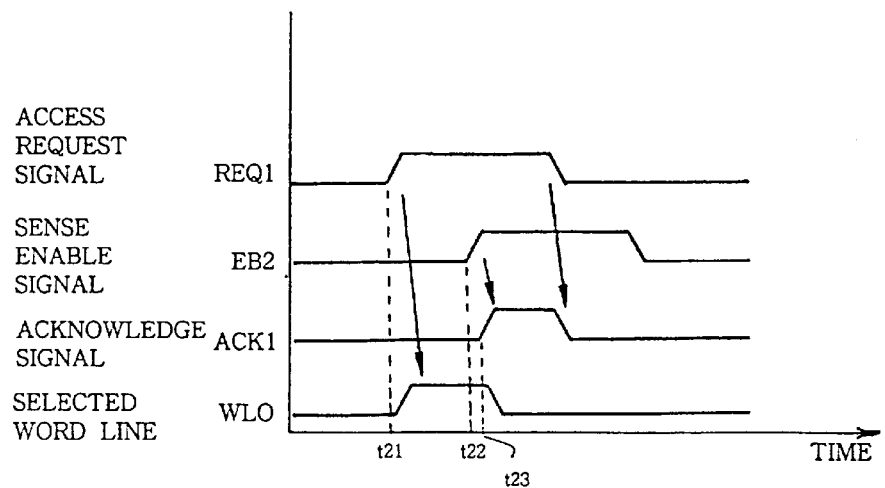
FIG. 5 is a timing chart showing a data read-out from the semiconductor static random access memory device.

The semiconductor static random access memory device behaves as follows. FIG. 5 illustrates a behavior of the semiconductor static random access memory device on the assumption that the word line WL0 is selected.

The external device supplies the external address signals to the semiconductor static random access memory device, and changes the access request signal to the active high level at time t21. The row address decoder 13 selectively changes the row address decoded signal lines 18 to the high level, and the row address decoded signals are representative of the row address assigned to the word line WL0.

The delay circuit 21 a keeps the output node thereof in the low level before reaching the access request signal REQ1, and the inverter IV1 maintains the inverted signal CDRQ at the high level. The AND gate AD10 is enabled with the inverted signal CDRQ. When the access request signal REQ1 arrives at the semiconductor static random access memory device, the AND gate AD10 immediately responds to the access request signal REQ1, and supplies the enable signal EB1 to the AND gates AD0 to ADm. Then, the AND gate AD0 changes the word line WL0 to the active high level, and the other AND gates keep the associated word lines in the inactive low level.

The memory cells M00–M0n are electrically connected to the associated bit line pairs BL0 to BLn, and stored data bits produce potential differences on the bit line pairs BL0 to BLn, respectively.

The access request signal REQ1 is propagated through the delay circuit 21a, and reaches the output node of the delay circuit 21a at time t22. Then, the sense enable signal EB2 is supplied to the sense amplifiers SA0 to SAn, and the sense amplifiers SA0 to SAn start to increase the potential differences on the bit line pairs BL0 to BLn. The column selector 16 selectively connects the bit line pairs BL0 to BLn to the input/output circuit 17, and the read-out data bits are selectively supplied from the bit line pairs BL0 to BLn through the column selector 16 to the input/output circuit 17.

The sense enable signal EB2 is further supplied to the AND gate AD11, and the AND gate AD11 changes the acknowledge signal ACK1 to the active high level at time t23. The acknowledge signal ACK1 is supplied to the external device.

As will be understood from the foregoing description, the external device asynchronously accesses data bits stored in the memory cell array 12 of the semiconductor static random access memory device through the handshake technology, i.e., the communication through the access request signal REQ1 and the acknowledge signal ACK1.

In the first embodiment, the row address decoder 13, the word line driver 14, the word lines WL0 to WLm, the bit line pairs BL0 to BLn, the sense amplifiers SA0 to SAn, the column address decoder 15, the column selector 16 and the input/output circuit 17 form parts of an accessing means. The timing generator 21 serves as a timing generating means. An asynchronous access controller described hereinlater serves a part of an external device.

Second Embodiment

Figure 6:
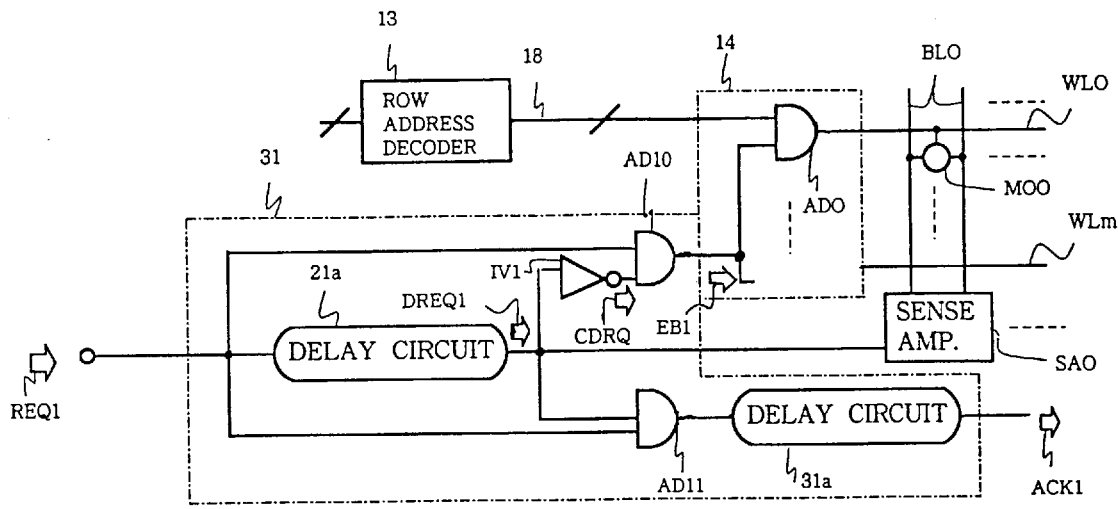
FIG. 6 is a circuit diagram showing another semiconductor static random access memory device according to the present invention.

FIG. 6 illustrates another semiconductor static random access memory device embodying the present invention. The semiconductor static random access memory device implementing the second embodiment is similar to the first embodiment except a timing generator 31. For this reason, signal lines and the other component units are labeled with the same references designating the corresponding signal lines and the other component units of the first embodiment without detailed description.

Figure 7:
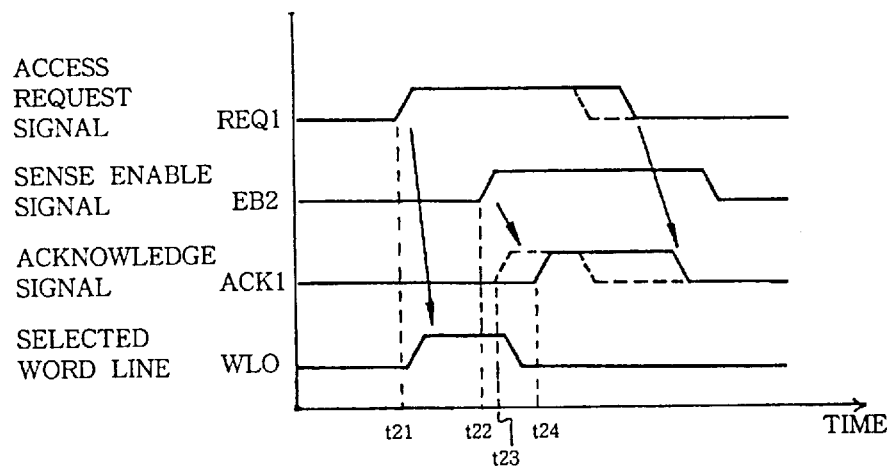
FIG. 7 is a timing chart showing a data read-out from the semiconductor static random access memory device.

A delay circuit 3 la is added to the circuit configuration of the timing generator 31. The delay circuit 31 a is connected to the output node of the AND gate AD11. The delay circuit 31a retards the rise of the acknowledge signal ACK1 and, accordingly, the fall of the access request signal REQ1. The fall of the acknowledge signal ACK1 is delayed as shown in FIG. 7. Thus, the manufacturer regulates the time period for the acknowledge signal ACK1 at the high level and the time period for the access request signal REQ1 at the low level to appropriate values by using the delay circuit 31a. If the semiconductor static random access memory device carries out a precharging operation on the bit line pairs during the low level of the access request signal REQ1, the manufacturer adjusts the time period for the access request signal REQ1 at the low level to the time period for the precharging operation. The delay circuit 31a may be inserted between the output node of the delay circuit 21a and the input node of the AND gate AD11 or the control signal node assigned to the access request signal REQ1 and the input node of the AND gate AD11.

The semiconductor static random access memory device shown in FIG. 6 allows an external device to asynchronously access the stored data bits by using the access request signal REQ1 and the acknowledge signal ACK1. The semiconductor static random access memory device per se accelerates the access, because any clock skew is required.

Asynchronous Access Controller

First Embodiment

Figure 8:
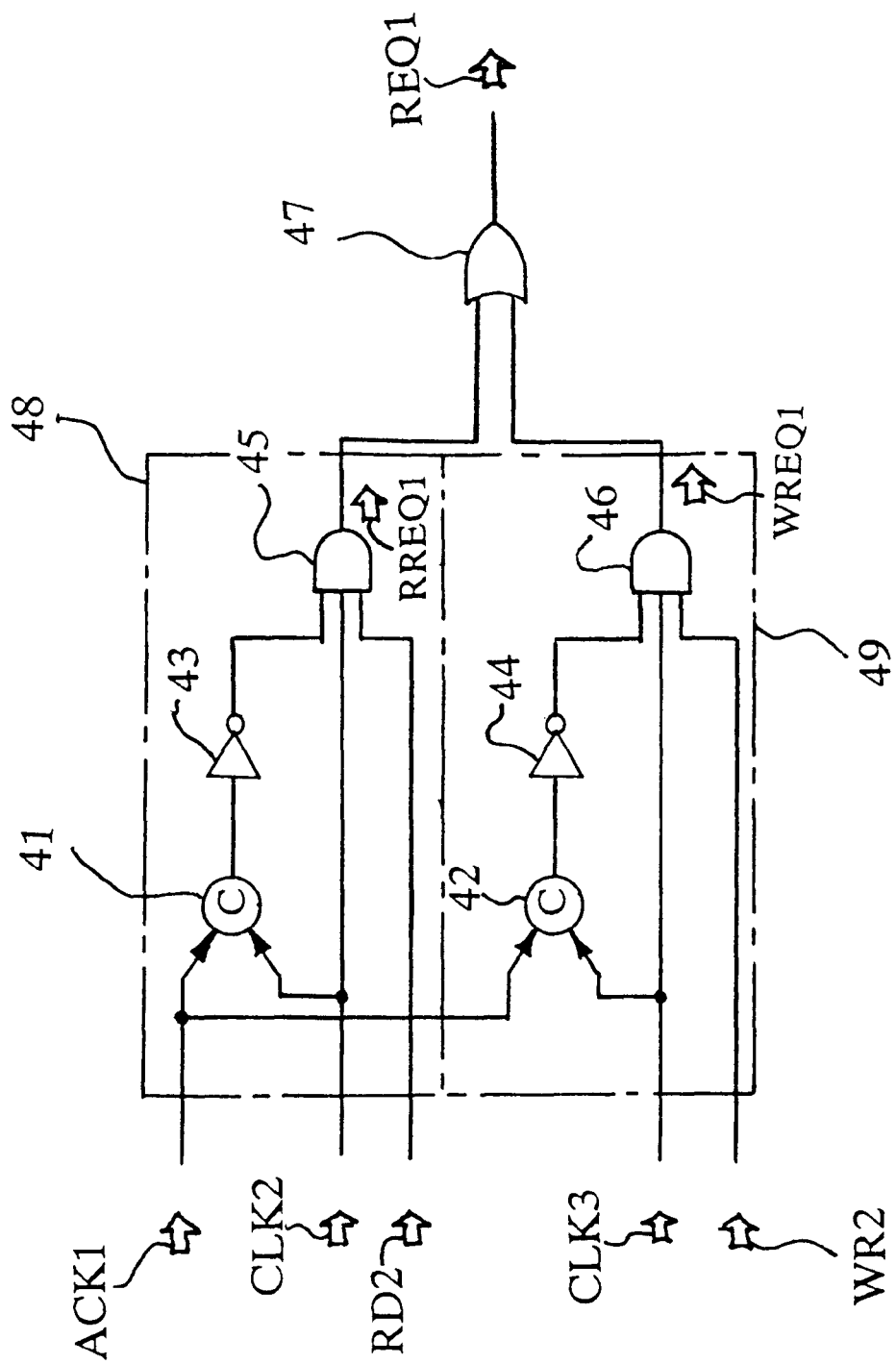
FIG. 8 is a circuit diagram showing the circuit configuration of an asynchronous access controller according to the present invention.

Turning to FIG. 8 of the drawings, an asynchronous access controller embodying the present invention comprises Muller's c-elements 41/42, inverters 43/44, AND gates 45/46 and an OR gate 47. The Muller's c-element 41, the inverter 43 and the AND gate 45 as a whole constitute a read request signal generating circuit 48, and the Muller's c-element 42, the inverter 44 and the AND gate 46 form in combination a write request signal generating circuit 49. The OR gate 47 serves as an access request signal generating circuit.

The acknowledge signal ACK1 is supplied to the Muller's c-elements 41/42, and clock signals CLK2/CLK3 are supplied to the other input nodes of the Muller's c-elements 41/42, respectively. The clock signal CLK2 is repeatedly changed between a high level and a low level, and the clock signal CLK3 is delayed from the clock signal CLK2. The clock signal CLK3 may be delayed from the clock signal CLK2 by 90 degrees. The asynchronous access controller may form a part of a data processor, and the data processor generates the address signals for an asynchronous data access.

The clock signals CLK2/CLK3 are directly supplied to the first input nodes of the AND gates 45/46, respectively. A read-out signal RD2 and a write-in signal WR2 are supplied to the second input nodes of the AND gates 45/46, respectively, and the output signals of the Muller's c-elements 41/42 are supplied through the inverters 43/44 to the third input nodes of the AND gates 45/46. The AND gate 45 generates a read-out request signal RREQ1, and supplies it to one input node of the OR gate 47. On the other hand, the AND gate 46 generates a write-in request signal WREQ1, and supplies it to the other input node of the OR gate 47. When at least one of the request signals RREQ1/WREQ1 is in logic "1" level, the OR gate 47 produces the access request signal REQ1.

Figure 9:
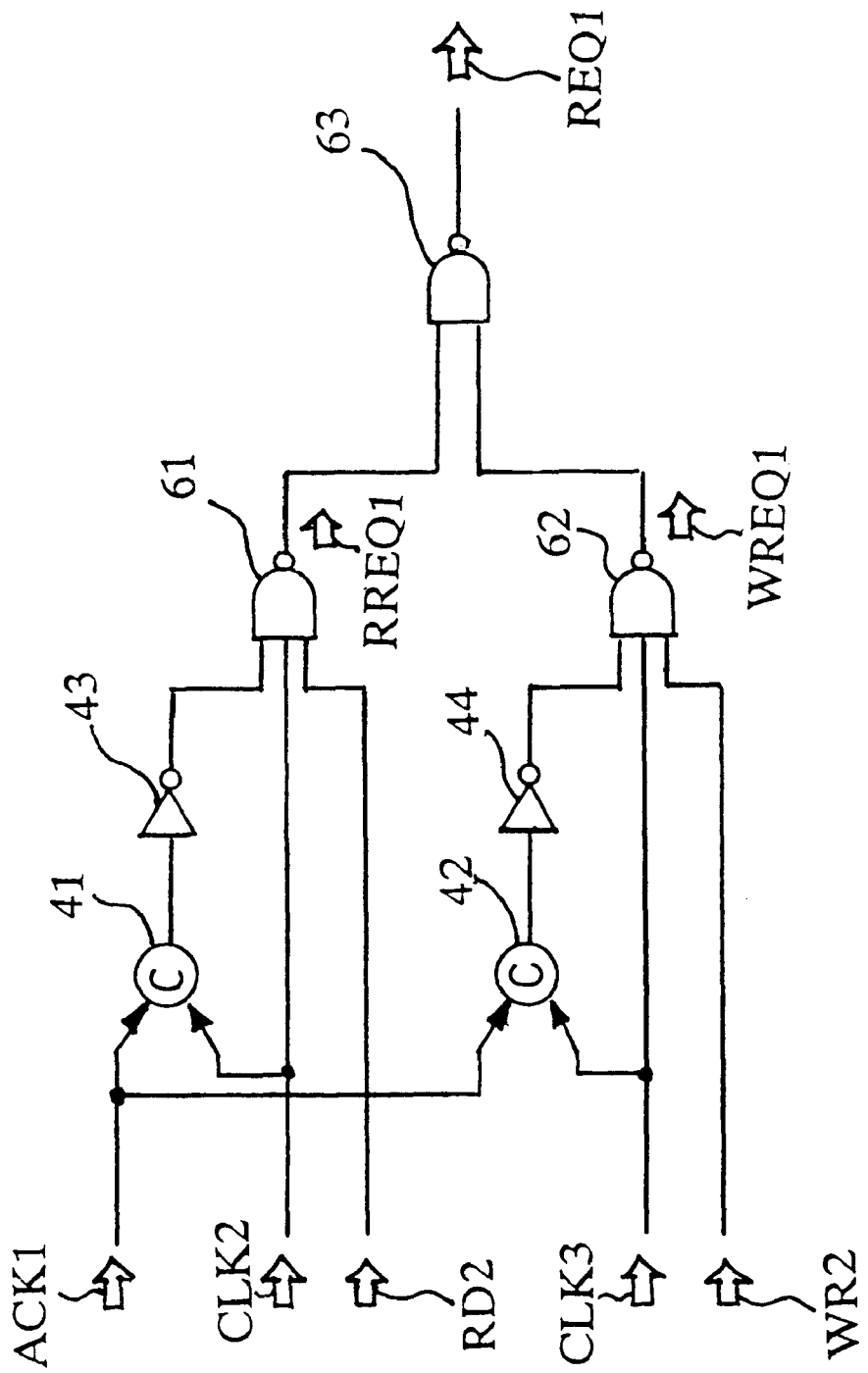
FIG. 9 is a circuit diagram showing the circuit configuration of another asynchronous access controller according to the present invention.

The AND gates 45/46 and the OR gate 47 may be replaced with NAND gates 61/62/63 as shown in FIG. 9. The data access signal REQ1 is produced at the output node of the NAND gate 63.

The Muller's c-element has two input nodes A/B and an output node C as shown in FIG. 10, and carries out a logical operation on the input nodes A/B. FIG. 11 illustrates the truth table for the Muller's c-element. When both inputs A/B are logic "0" level, the Muller's c-element yields logic "1" level. When one of the inputs A/B is logic "0" level and the other input B/A is logic "1" level, the Muller's c-element maintains the previous logic level C. If both inputs A/B are logic "1" level, the Muller's c-element produces logic "1" level.

The Muller's c-element is disclosed by Nanya in "Asynchronous Processors-Toward Ultrahigh-Speed VLSI Systems", Information Processing vol. 34, No. 1, January 1993, page 76 and by Takamura et. al., in "Speed-up Enhanced Technologies in Logic Design of Asynchronous Processor TITAC-2", Papers of Electronic Information Communication Society, D-I, vol. 380-D-1, No. 3, March 1997, page 189 to page 196. The Muller's c-element is also disclosed in 1991 IEEE International Solid State Circuits Conference, pages 92–p93, 1991 IEEE International Solid State Transactions on Computer-Aided Design, vol. 8, No. 11, November 1989, pages 1185 to 1205.

FIG. 12 illustrates a circuit configuration of the Muller's c-element disclosed by Kagotani et al in "Speed-Up for Two-Phase Asynchronous Circuit", papers of Electronic Information Communication Society, D-I, vol., J78-D-I, No. 4, April 1995. Four NAND gates 51/52/53/54 form in combination the Muller's c-element. Input A is supplied to one input node of the NAND gate 51 and one input node of NAND gate 52, and input B is supplied to the other input node of NAND gate 52 and one input node of NAND gate 53. The output signals of NAND gates 51/52/53 are supplied to the three input nodes of NAND gate 54, and the output signal of NAND gate 54 is supplied to the other input node of NAND gate 51 and the other input node of NAND gate 53. The output signal of NAND gate 54 serves as the output signal "c" of the Muller's c-element. The NAND gates 51/52/53/54 thus arranged achieve the logic function shown in the truth table shown in FIG. 10. Any kind of Muller's c-element is available for the asynchronous access controller.

Figure 1:
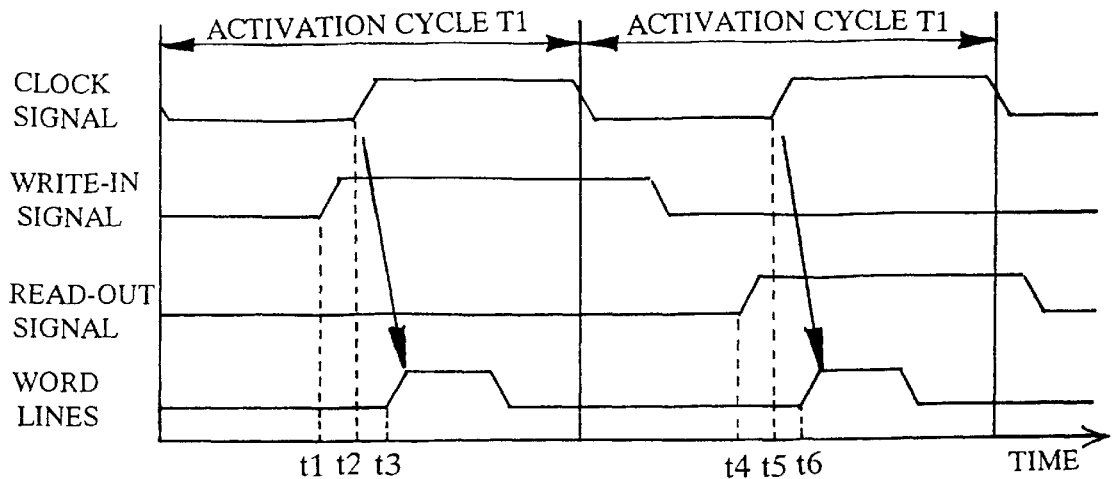
FIG. 1 is a timing chart showing the selective activation of word lines carried out in the synchronous access.
Figure 2:
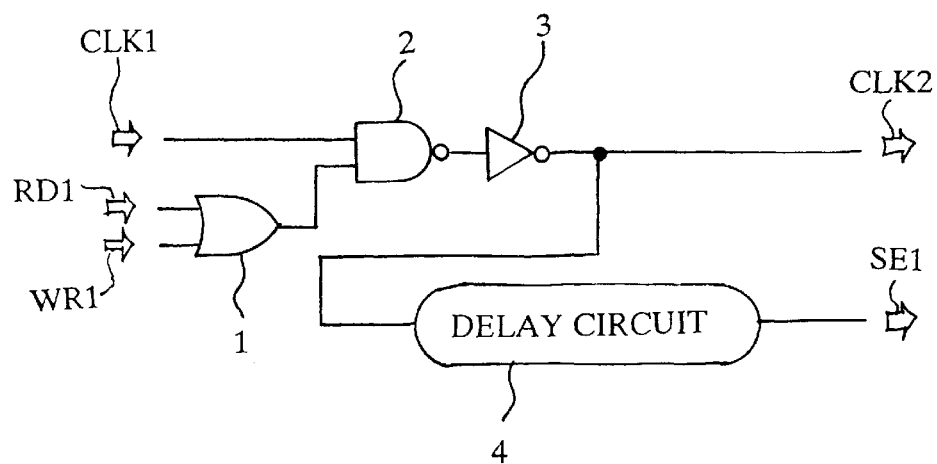
FIG. 2 is a circuit diagram showing the circuit configuration of the prior art timing generator for generating the sense enable signal.
Figure 3:
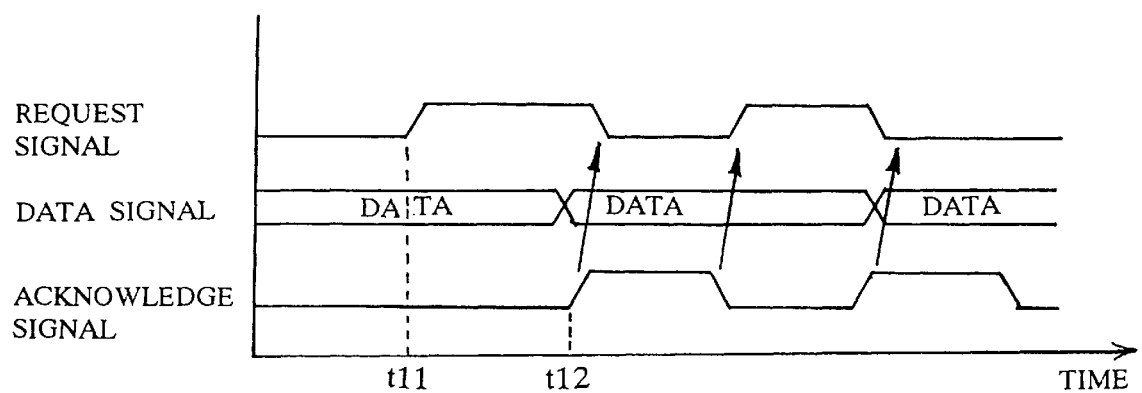
FIG. 3 is a timing chart showing the sequential access through the handshake.
Figure 13:
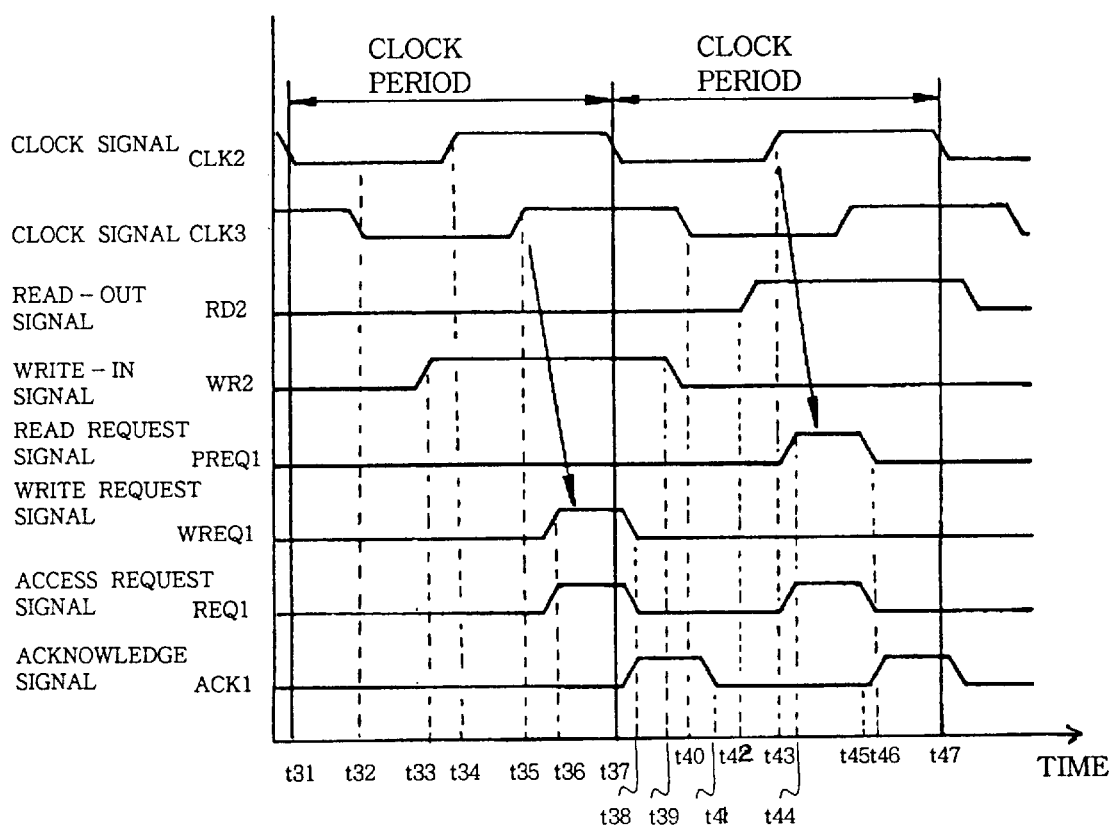
FIG. 13 is a timing chart showing the behavior of the asynchronous access controller shown in FIG. 8.

The asynchronous access controller shown in FIG. 8 behaves as shown in FIG. 13. The write request signal WREQ1, the read request signal RREQ1, the access request signal REQ1 and the acknowledge signal ACK1 are in the low level at time t31. The clock signal CLK3 falls low at time t32, and both clock signals CLK2/CLK3 are in the low level. The Muller's c-element 41/42 maintain the output signals thereof at logic "0" level (see FIG. 1) or the low level, and the inverters 43/44 supply the output signals of the high level to the AND gates 45/46, respectively.

The write-in signal WR2 rises to the high level at time t33, and falls low at time t39. However, the read-out signal RD2 is not changed to the high level in the clock period from time t31 to time t37. For this reason, description is focused on the write-request signal. The clock signal CLK3 is changed to the high level at time t35. Although the clock signal CLK3 is supplied to the Muller's c-element 42, the Muller's c-element 42 maintains the previous logic level, i.e., logic "0", and the inverter 44 continuously supplies logic "1" level to the AND gate 46. The clock signal CLK3 of the high level causes the AND gate 46 to change the write request signal WREQ1 to the high level at time t36, and, accordingly, the OR gate 47 changes the access request signal REQ1 to the high level.

Write-in data is written into the semiconductor memory device, and the semiconductor memory device changes the acknowledge signal ACK1 to the high level. The acknowledge signal ACK1 returns to the asynchronous access controller at time t37, and both input nodes of the Muller's c-element 42 are in the high level. Then, the Muller's c-element 42 changes the output signal to the logic "1" level (see FIG. 11) or the high level, and the inverter 44 changes the output signal to logic "0" level or the low level. As a result, the AND gate 46 changes the write request signal WREQ1 to the low level at time t38, and the OR gate 47 changes the access request signal REQ1 to the low level. The acknowledge signal ACK1 returns to the low level at time 41, and all the signals become low.

In the next clock period from time t37 to time t47, the asynchronous access controller supplies the access request signal REQ1 to the semiconductor memory device for reading out stored data from the semiconductor memory device. The read-out signal RD2 rises to the high level at time t42, and the clock signal CLK2 is changed to the high level at time t43. The Muller's c-element 43 has supplied the output signal of the low level before time t43, and maintains the output signal at the previous level at time t43. As a result, the AND gate 45 changes the read request signal RREQ1 to the high level at time t44, and, accordingly, the OR gate 47 changes the access request signal REQ1 to the high level. The time interval between the access request signal REQ1 is shorter than the clock period by virtue of the clock signals CLK2/CLK3 different in phase from each other.

The semiconductor memory device outputs the read-out data, and changes the acknowledge signal ACK1 to the high level. The acknowledge signal ACK1 returns to the asynchronous access controller at time t45, and both input nodes of the Muller's c-element 41 are in the high level. Then, the Muller's c-element 41 changes the output signal to the high level, and, accordingly, the inverter 43 changes the output signal to the low level. As a result, the AND gate 45 changes the read request signal RREQ1 to the low level at time t46, and the OR gate 47 changes the access request signal REQ1 to the low level.

As will be understood from the foregoing description, the asynchronous access controller uses two clock signals CLK2/CLK3 different in phase from each other, and the two clock signals CLK2/CLK3 make the time interval between the access request signal REQ1 shorter than the clock period. In other words, the asynchronous access controller supplies the access request signal to the semiconductor memory device at different timings in the clock periods, i.e., time t36 and time t44.

Second Embodiment

Figure 14:
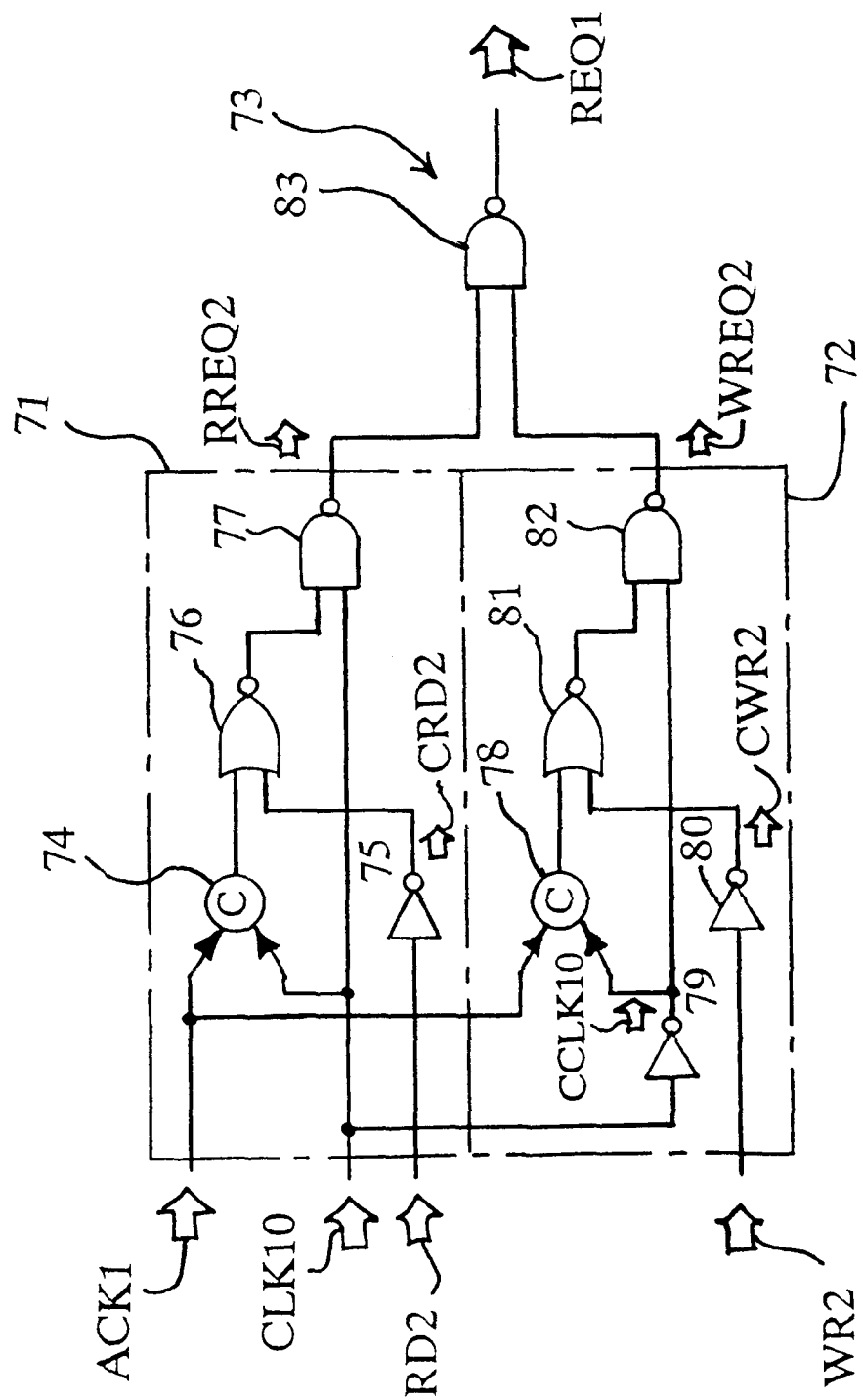
FIG. 14 is a circuit diagram showing the circuit configuration of another asynchronous access controller.

FIG. 14 illustrates another asynchronous access controller embodying the present invention. The asynchronous access controller largely comprises a read request signal generating circuit 71, a write request signal generating circuit 72 and a access request signal generating circuit 73. The acknowledge signal ACK1 is supplied from the semiconductor memory device, and the read-out signal RD2 and the write-in signal WR2 are, by way of example, supplied from a kind of decoder of a data processor. The asynchronous access controller may form a part of the data processor. Only one clock signal CLK10 is supplied to the asynchronous access controller, and the inverted clock signal CCLK10 is internally produced from the clock signal CLK10.

The read request signal generating circuit 71 includes a Muller's c-element 74, an inverter 75, a NOR gate 76 and a NAND gate 77, and the write request signal generating circuit 72 includes a Muller's c-element 78, inverters 79/80, A NOR gate 81 and a NAND gate 82. The access request signal generating circuit 73 is implemented by a NAND gate 83. The acknowledge signal ACK1 is supplied to the first input nodes of the Muller's c-elements 74/78. The clock signal CLK10 is directly supplied to the second input node of the Muller's c-element 74 and the inverter 79, and the inverter 79 supplies the inverted clock signal CCLK10 to the second input node of the other Muller's c-element 78. The clock signal CLK10 and the inverted clock signal CCLK10 are supplied to the NAND gates 77/82, respectively. Thus, the clock signal CLK3 is replaced with the inverted clock signal CCLK10 in the second embodiment.

The read-out signal RD2 is supplied to the inverter 75, and the inverted read-out signal CRD2 is NORed with the output signal of the Muller's c-element 74. The output signal of the NOR gate 76 is NANDed with the clock signal CLK10, and the NAND gate 77 supplies a read request signal RREQ2 to the NAND gate S3.

Similarly, the write-in signal WR2 is supplied to the inverter 80, and the inverted write-in signal CWR2 is NORed with the output signal of the other Muller's c-element 78. The output signal of the NOR gate 81 is NANDed with the inverted clock signal CCLK10, and the NAND gate 82 supplies a write request signal WREQ2 to the NAND gate 83. The NAND gate 83 yields the access request signal REQ1 from the read request signal RREQ2 and the write request signal WREQ2.

Figure 15:
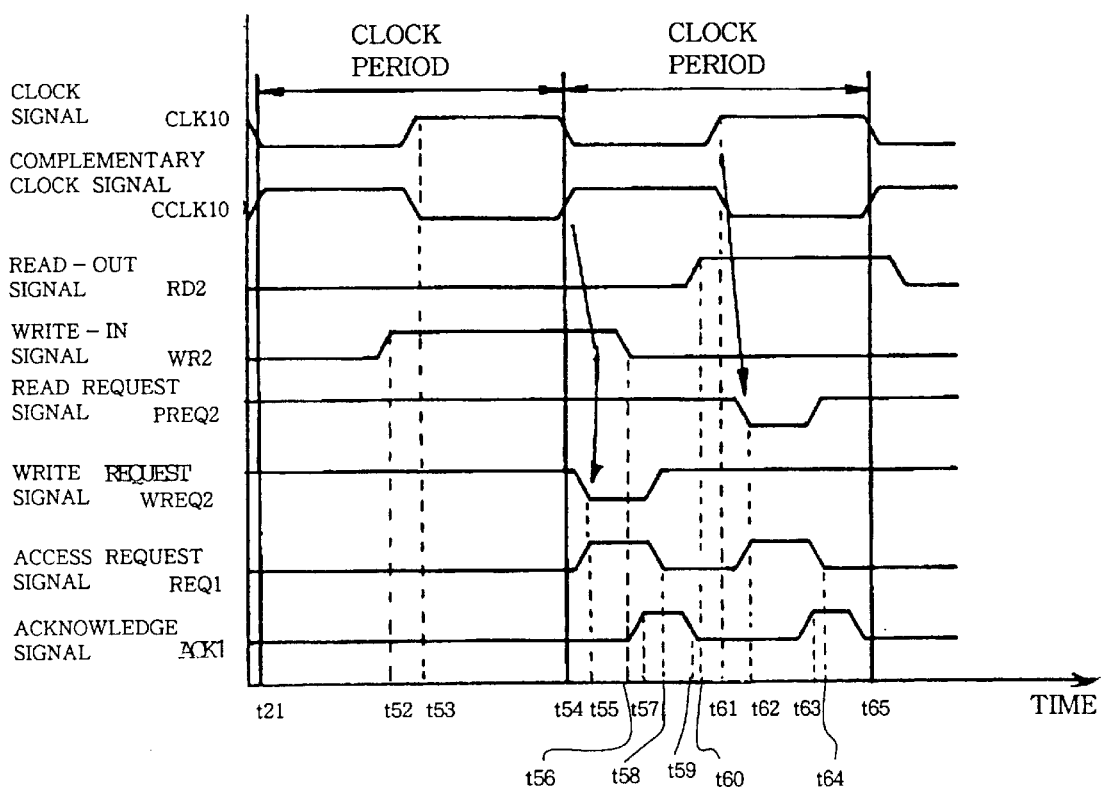
FIG. 15 is a timing chart showing the behavior of the asynchronous access controller shown in FIG. 14.

FIG. 15 illustrates the circuit behavior of the asynchronous access controller implementing the second embodiment. The clock signal CLK10 is repeatedly changed between a high level and a low level at clock periods.

The semiconductor memory device maintains the acknowledge signal ACK1 at the low level in the clock period from time t51 to time t54. Although the inverted clock signal CCLK10 is changed to the high level at time t51, the Muller c-element 78 maintains the output signal in the low level.

The write-in signal WR2 rises to the high level at time t52, and the inverter supplies the inverted write-in signal CWR2 to the low level. The inverted write-in signal CWR2 makes the NOR gate 81 enable. The inverted clock signal CCLK10 is changed to the low level at time t53, and the Muller's c-element maintains the output signal in the low level. The NOR gate 81 yields the output signal of the high level, which in turn makes the NAND gate 82 enable. The complementary clock signal CCLK2 of the low level causes the NAND gate 83 to keep the write-request signal high.

Although the clock signal CLK10 is changed to the high level at time t53, the acknowledge signal ACK1 causes the other Muller's c-element 74 to maintain the output signal in the low level, and the NOR gate 76 is enabled with the output signal of the low level. The read-out signal RD2 is maintained at the low level, and the inverter 75 keeps the inverted read-out signal CRD2 at the high level. For this reason, the NOR gate 76 yields the output signal of the low level. The NAND gate 77 is disabled with the output signal of the NOR gate 76, and maintains the read request signal RREQ2 in the high level. Thus, the and the access request signal REQ1 is in the low level. Thus, the read request signal RREQ2 and the write request signal WREQ2 are maintained at the high level in the clock period from time t51 to time t54, and the access request signal is not changed to the high level in the clock period from time t5 1 to time t54.

The clock signal CLK10 is changed to the low level at time t54, and, accordingly, the inverted clock signal CCLK10 is changed to the high level. The NAND ate 82 changes the write request signal WREQ2 to the low level at time t55, and the NAND gate 83 supplies the access request signal REQ1 of the high level to the semiconductor memory device.

The write-in signal WR2 is changed to the low level at time t56. The semiconductor memory device stores write-in data, and changes the acknowledge signal ACK1 to the high level at time t57. The acknowledge signal ACK1 of the high level causes the Muller's c-element 78 to change the output signal to the high level, and the NOR gate 81 changes the output signal to the low level. Then, the NAND gate 82 changes the write request signal WREQ2 to the high level. This results in that the NAND gate 83 changes the output signal REQ1 to the low level.

The acknowledge signal ACK1 falls low at time t59. The read-out signal RD2 is changed to the high level at time t60, and the clock signal CLK10 rises to the high level at time t61. The Muller's c-element 74 still maintains the output signal at the low level, and the inverter 75 changes the complementary read-out signal RD2 to the low level. The NOR gate 76 changes the output signal to the high level, and the NAND gate 77 changes the read request signal RREQ2 to the low level. As a result, the NAND gate 83 changes the access request signal REQ1 to the high level.

Read-out data is output from the semiconductor memory device, and the acknowledge signal ACK1 is changed to the high level at time t63. The acknowledge signal ACK1 of the high level makes the Muller's c-element 74 to change the output signal to the high level, and the NOR gate changes the output signal to the low level. As a result, the NAND gate 77 changes the read request signal RREQ2 to the high level, and the access request signal REQ1 is recovered to the low level at time t64. Finally, the acknowledge signal ACK1 is changed to the low level.

Thus, the access request signal REQ1 is twice changed to the active high level in the clock period from time t54 to time t65, and the semiconductor memory device carries out the write-in operation and the read-out operation in the single clock period.

Third Embodiment

Figure 16:
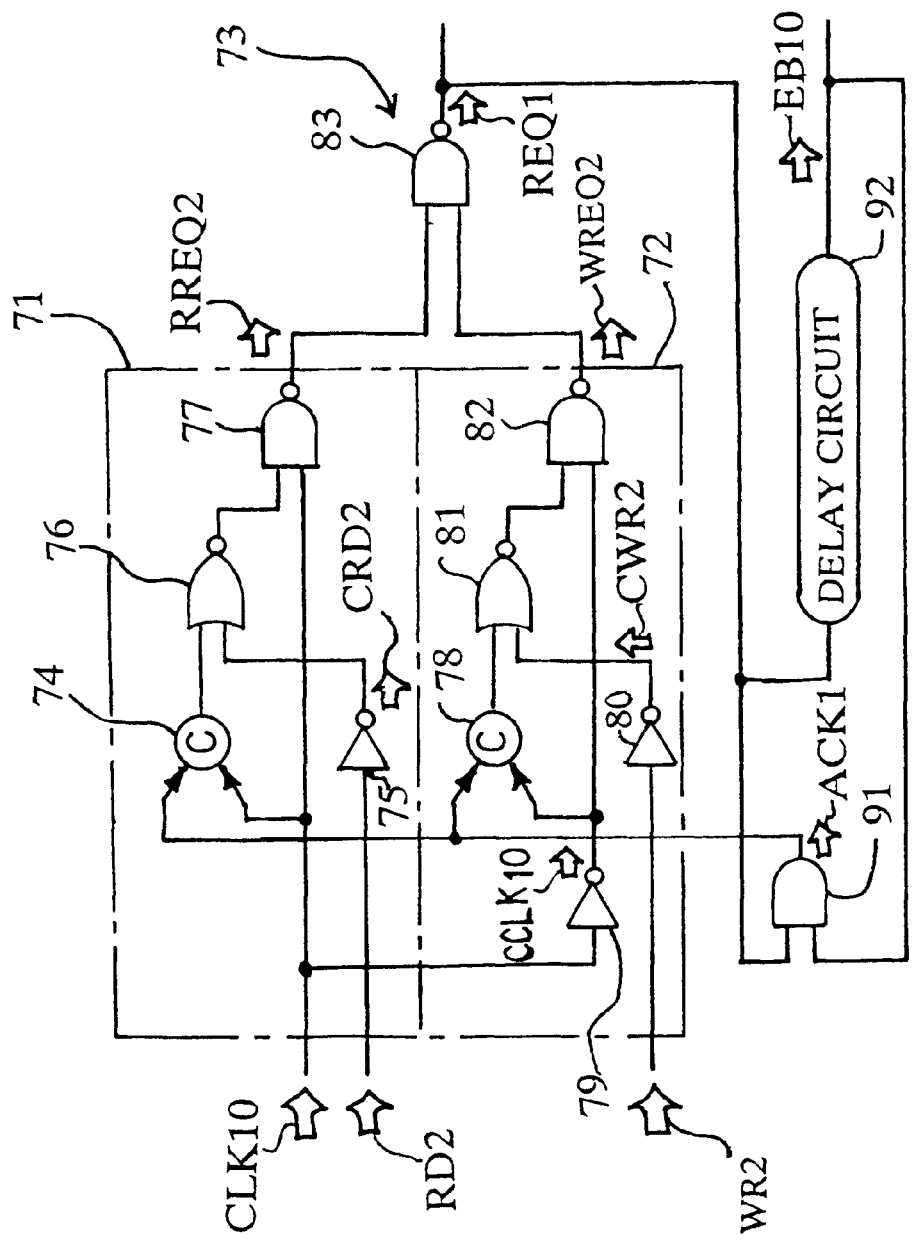
FIG. 16 is a circuit diagram showing the circuit configuration of yet another asynchronous access controller.

FIG. 16 illustrates yet another asynchronous access controller embodying the present invention. The asynchronous access controller is integrated on a semiconductor chip together with the semiconductor memory device. For this reason, the asynchronous access controller shown in FIG. 14 is combined with a part of the timing generator 21. For this reason, circuit components of the asynchronous access controller are labeled with the same references designating corresponding circuit components of the asynchronous access controller shown in FIG. 14 without detailed description.

The output node of the NAND gate 83 is connected to one input node of an AND gate 91 and an input node of a delay circuit 92. The delay circuit 92 introduces time delay between the access request signal REQ1 of the active high level and a sense enable signal EB10 of the active high level. The sense enable signal EB10 is supplied to the sense amplifiers SA0 to SAn (see FIG. 4), and makes the sense amplifiers SA0 to SAn active. The sense enable signal EB10 is further supplied to the other input node of the AND gate 91, and the AND gate 91 produces the acknowledge signal ACK1. The acknowledge signal ACK1 is supplied to the Muller's c-elements 74/78.

The read request signal generating circuit 71, the write request signal generating circuit 72 and the access request signal generating circuit 73 behave as similar to those of the asynchronous access controller shown in FIG. 14. For this reason, description is focused on generation of the acknowledge signal ACK1 and the sense enable signal EB10.

Figure 17:
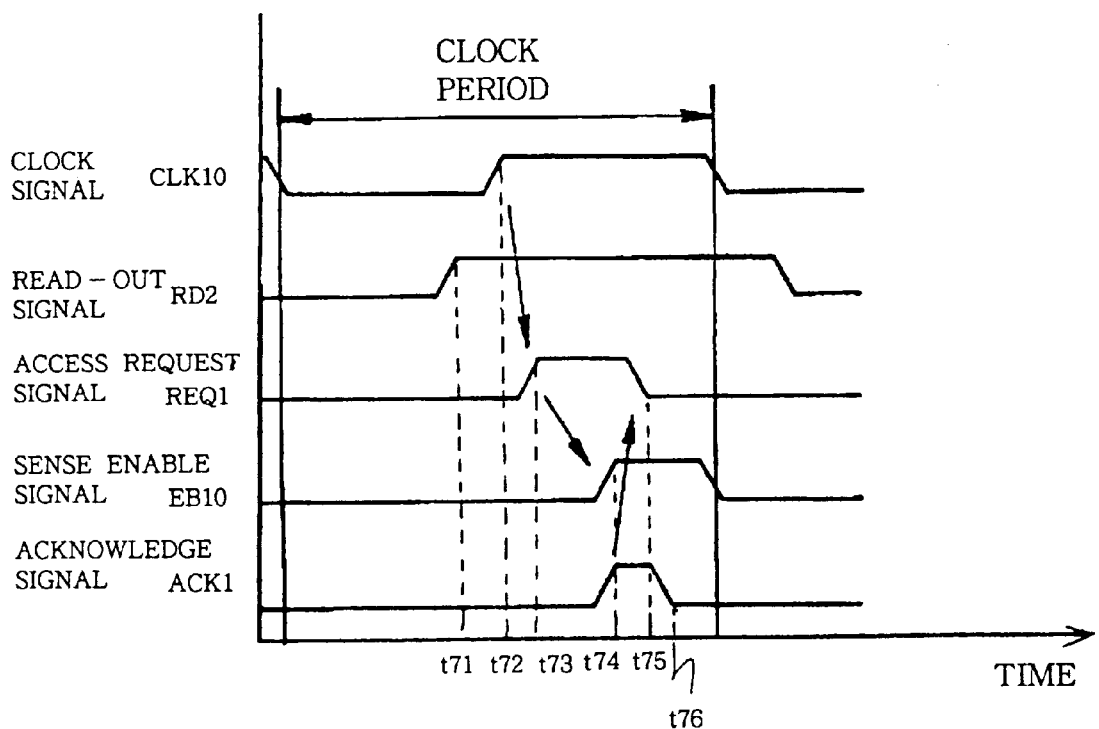
FIG. 17 is a timing chart showing the behavior of the asynchronous access controller shown in FIG. 14.

FIG. 17 illustrates the generation of the sense enable signal EB10 and the acknowledge signal ACK1. The read-out signal RD2 rises to the high level at time t71, and the clock signal CLK10 is changed to the high level at time t72. The read request signal generating circuit 71 and the NAND gate 83 changes the access request signal REQ1 to the high level at time 73.

The access request signal REQ1 is supplied to the delay circuit 92 and the AND gate 91. The AND gate 91 is enabled with the access request signal REQ1, and the delay circuit 92 introduces the time delay. The delay circuit 92 changes the sense enable signal EB10 to the high level at time t74, and the sense enable signal EB10 causes the AND gate 91 to change the acknowledge signal ACK1 to the high level. With the acknowledge signal ACK1, the read request signal generating circuit 71 and the NAND gate 83 change the access request signal REQ1 to the low level at time t75, and, accordingly, the AND gate 91 recovers the acknowledge signal ACK1 to the low level at time t76.

The asynchronous access controller achieves all the advantages of the second embodiment.

Fourth Embodiment

Figure 18:
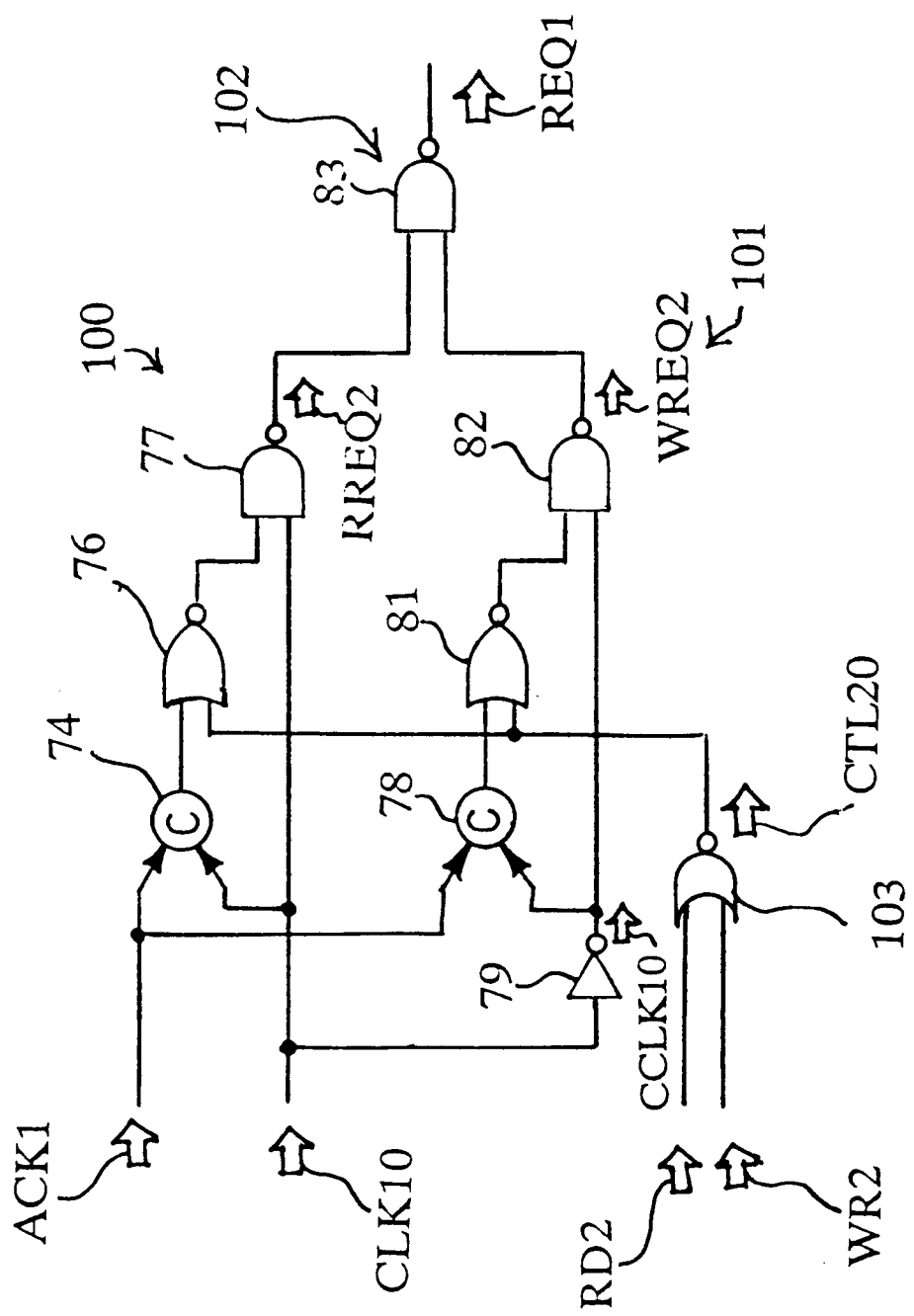
FIG. 18 is a circuit diagram showing the circuit configuration of still another asynchronous access controller.

FIG. 18 illustrates still another asynchronous access controller embodying the present invention. The asynchronous access controller implementing the fourth embodiment is broken down into a read request signal generating circuit 100, a write request signal generating circuit 101 and an access request signal generating circuit 10 as similar to the second embodiment. A difference from the second embodiment is that the inverters 75/80 are replaced with a NOR gate 103. For this reason, the NOR gate 103 is shared between the read request signal generating circuit 100 and the write request signal generating circuit 1001. The other circuit components of the fourth embodiment are labeled with the same references designating corresponding circuit components of the second embodiment.

The read-out signal RD2 and the write-in signal WR2 are supplied to the input nodes of the NOR gate 103. The NOR gate 103 maintains a control signal CTL20 to the low level except when both signals RD2/WR2 are in the low level. The control signal CTL20 is supplied to the NOR gates 76/81.

Figure 19:
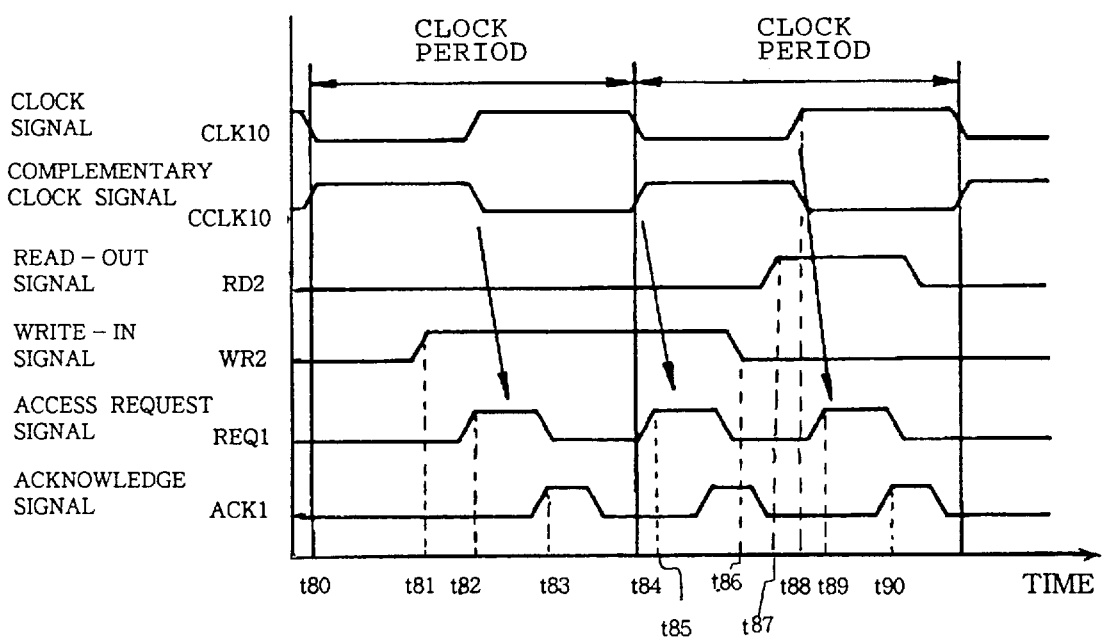
FIG. 19 is a timing chart showing the behavior of the asynchronous access controller shown in FIG. 18.

The asynchronous access controller behaves as shown in FIG. 19. The acknowledge signal ACK1 is in the low level at time t80. The clock signal CLK10 is changed to the low level at time t80, and, accordingly, the inverted clock signal CCLK10 is changed to the high level. For this reason, both Muller's c-elements 74/78 produces the output signals of the low level at time t80, and the NOR gates 76/81 are enabled with the output signals of the Muller's c-elements 74/78.

Although both of the read-out signal RD2 and the write-in signal WR2 are in the low level at time t80, the write-in signal WR2 is changed to the high level at time t81, and the NOR gate 103 changes the control signal CTL20 to the low level. Then, the NOR gates 76/81 changes the output signals to the high level, and make the NAND gates 77/82 enable. The clock signal CLK10 of the low level causes the NAND gate 77 to maintain the read request signal RREQ2 in the high level, and the inverted clock signal CCLK10 of the high level causes the NAND gate 82 to change the write request signal WREQ2 to the low level. As a result, the NAND gate 83 changes the access request signal REQ1 to the high level at time t82.

The access request signal REQ1 is supplied to the semiconductor memory device, and write-in data are stored in the memory cell array. The semiconductor memory device changes the acknowledge signal ACK1 to the high level at time t83, and the Muller's c-element 78 changes the output signal to the high level. Then, the NOR gate 81 changes the output signal to the low level, and the NAND gate 82 changes the write request signal WREQ2 to the high level. Thus, the asynchronous access controller recovers the access request signal REQ1 to the low level.

The write-in signal WR2 is maintained at the high level, and the inverted clock signal CCLK10 is changed to the high level at time t84, again. The write-in signal WR2 is recovered to the low level at time t86, and the read-out signal RD2 is changed to the high level at time t87. The NOR gate 103 changes the control signal CTL20 to the low level, and the NOR gates 76/81 are enabled, again. The NOR gates 76/81 supply the output signals of the high level to the associated NAND gates 77/82, and make the NAND gates 77/82 enable. The clock signal CLK10 is changed to the high level at time t88, and the inverted clock signal CCLK10 is changed to the low level. As a result, the NAND gate 77 changes the read request signal RREQ2 to the low level, and the NAND gate 82 maintains the write request signal WREQ2 at the high level. Then, the NAND gate 83 changes the access request signal REQ1 to the high level at time t89.

The semiconductor memory device outputs read-out data, and changes the acknowledge signal ACK1 to the high level at time t90. The acknowledge signal ACK1 causes the Muller's c-element 74 to change the output signal to the high level, and the asynchronous access controller changes the access request signal REQ1 to the low level.

The asynchronous access controller changes the access request signal REQ1 to the high level at the different timings t85/t89 in a single clock period. The access request signal REQ1 for the data write-in is earlier than the access request signal REQ1 for the data read-out. For this reason, even if the data write-in is causative of long time delay, the cycle time is never prolonged. The clock signals CLK10 and the inverted clock signal CCLK10 are desirable for the asynchronous access controller, because a high speed clock, which is twice higher in frequency than the clock signal CLK10, is not required.

Although particular embodiments of the present invention have been shown and described, it will be apparent to those skilled in the art that various changes and modifications may be made without departing from the spirit and scope of the present invention.

For example, the asynchronous data access according to the present invention is never limited to the semiconductor static random access memory device. The timing generator 21 may be incorporated in another kind of semiconductor memory device. The AND gate AD10/AD11 may be replaced with another kind of logic gate such as, for example, a NOR gate or a NAND gate. The delay circuit 31a does not affect the generation of the enable signal EB1, and the enable signal EB1 is produced at the same timing as that of the first embodiment.

Only the asynchronous access controller may be integrated on a single semiconductor chip separately from the semiconductor memory device and a semiconductor microprocessor.

What is claimed is:

1. A semiconductor memory device comprising:
   a memory cell array including a plurality of memory cells for storing data bits in a readable manner, respectively,
   an accessing unit responsive to a plurality of internal control signals for allowing an external device to selectively access said data bits, and
   a timing generating unit that includes a delay circuit, said timing generating unit being responsive to an access request signal for sequentially generating said plurality of internal control signals without a clock signal and an acknowledge signal at a predetermined timing relating to the generation of one of said plurality of internal control signals,
   wherein a request delayed signal is generated by said timing venerating unit by delaying said access request signal using said delay circuit, and wherein said request delayed signal is used to generate said acknowledge signal.

2. The semiconductor memory device as set forth in claim 1, wherein said timing generating unit generates said acknowledge signal in the concurrent presence of said access request signal of an active level and said one of said plurality of internal control signals of said active level, and said access request signal is recovered from said active level to an inactive level when said acknowledge signal of said active level reaches a source of said access request signal.

3. The semiconductor memory device as set forth in claim 2 wherein said accessing unit includes at least one sense amplifier for amplifying a data bit read out from said memory cell array, and said one of said plurality of internal clock signals is used for activating said at least one sense amplifier.

4. The semiconductor memory device as set forth in claim 3, wherein said at least one sense amplifier further amplifies a data bit to be written into said memory cell array.

5. The semiconductor memory device as set forth in claim 1, wherein said accessing unit includes:
   a plurality of word lines selectively connected to said plurality of memory cells for selecting memory cells from said memory cell array,
   a word line driver connected to said plurality of word lines and responsive to said another of said plurality of internal control signals for selectively changing said plurality of word lines to an active level, and
   at least one sense amplifier responsive to said one of said plurality of internal control signals for amplifying a data bit supplied from one of said memory cells.

6. The semiconductor memory device as set forth in claim 5, wherein said timing generating unit further includes:
   a first logic circuit supplies with said access request signal of said active level and said one of said plurality of internal control signals output from said delay circuit for producing said another of said plurality of internal control signals, and
   a second logic circuit supplied with said access request signal of said active level and said one of said plurality of internal control signals for producing said acknowledge signal.

7. The semiconductor memory device as set forth in claim 6, wherein said first logic circuit has an inverter having an input node connected to said delay circuit and a first AND gate having a first input node supplied with said access request signal and a second input node connected to an output node of said inverter, and
   said second logic circuit is a second AND gate.

8. The semiconductor memory device as set forth in claim 6, wherein said timing generating unit further includes a second delay circuit connected to an output node of said second logic circuit for introducing a time delay between said one of said plurality of internal control signals and said acknowledge signal.

9. An asynchronous access controller for generating an access request signal used for an asynchronous data access to a data storing circuit, comprising:
   a read request signal generating circuit including
      a first Muller's c-element supplied with an acknowledge signal from said data storing circuit and a first clock signal and producing a first output signal of a first logic level from said acknowledge signal of said first logic level and said first clock signal of said first logic level and said first output signal of a second logic level opposite to said first logic level from said acknowledge signal of said second logic level and said first clock signal of said second logic level and maintaining the logic level of said first output signal when said acknowledge signal is opposite in logic level from said first clock signal and
      a first logic circuit responsive to said first output signal of said first logic level and a read-out signal of an active level for generating a read request signal of an active level,
   a write request signal generating circuit including
      a second Muller's c-element supplied with said acknowledge signal from said data storing circuit and a second clock signal different in phase from said first clock signal and producing a second output signal of said first logic level from said acknowledge signal of said first logic level and said second clock signal of said first logic level and said second output signal of said second logic level from said acknowledge signal of said second logic level and said second clock signal of said second logic level and maintaining the logic level of said second output signal when said acknowledge signal is opposite in logic level from said second clock signal and
      a second logic circuit responsive to said second output signal of said first logic level and a write-in signal of an active level for generating a write request signal of an active level, and
      a third logic circuit responsive to one of said read request signal of said active level and said write request signal of said active level for generating an access request signal of an active level.

10. The asynchronous access controller as set forth in claim 9, wherein said second clock signal is delayed from said first clock signal.

11. The asynchronous access controller as set forth in claim 10, wherein said first logic circuit includes
   a first inverter having an input node connected to an output node of said first Muller's c-element where said first output signal is generated, and
   a first AND gate having a first input node connected to an output node of said first inverter, a second input node supplied with said first clock signal and a third input node supplied with said read-out signal,
   said second logic circuit includes
   a second inverter having an input node connected to an output node of said second Muller's c-element where said second output signal is generated, and
   a second AND gate having a first input node connected to an output node of said second inverter, a second input node supplied with said second clock signal and a third input node supplied with said write-in signal, and
   said third logic circuit includes an OR gate having a first input node connected to an output node of said first AND gate and a second input node connected to an output node of said second AND gate and an output node for producing said access request signal.

12. The asynchronous access controller as set forth in claim 10, wherein said first logic circuit includes
   a first inverter having an input node connected to an output node of said first Muller's c-element where said first output signal is generated, and
   a first NAND gate having a first input node connected to an output node of said first inverter, a second input node supplied with said first clock signal and a third input node supplied with said read-out signal,
   said second logic circuit includes
   a second inverter having an input node connected to an output node of said second Muller's c-element where said second output signal is generated, and
   a second NAND gate having a first input node connected to an output node of said second inverter, a second input node supplied with said second clock signal and a third input node supplied with said write-in signal, and
   said third logic circuit includes a third NAND gate having a first input node connected to an output node of said first NAND gate and a second input node connected to an output node of said second NAND gate and an output node for producing said access request signal.

13. The asynchronous access controller as set forth in claim 9, wherein said second clock signal is 180 degrees different in phase from said first clock signal.

14. The asynchronous access controller as set forth in claim 13, wherein
   said first logic circuit includes
   a first inverter having an input node supplied with said read-out signal,
   a first NOR gate having a first input node connected to an output node of said first Muller's c-element and a second input node connected to an output node of said first inverter and
   a first NAND gate having a first input node connected to an output node of said first NOR gate and a second input node supplied with said first clock signal,
   said second logic circuit includes
   a second inverter having an input node supplied with said write-in signal,
   a second NOR gate having a first input node connected to an output node of said second Muller's c-element and a second input node connected to an output node of said second inverter and
   a second NAND gate having a first input node connected to an output node of said second NOR gate and a second input node supplied with said second clock signal, and
   said third logic circuit has a third NAND gate having a first input node connected to an output node of said first NAND gate and a second input node connected to an output node of said second NAND gate.

15. The asynchronous access controller as set forth in claim 14, further comprising a third inverter for producing said second clock signal from said first clock signal.

16. The asynchronous access controller as set forth in claim 15, further including a controlling signal generating circuit for producing one of a plurality of internal control signals supplied to said data storing circuit and said acknowledge signal.

17. The asynchronous access controller as set forth in claim 16, wherein said controlling signal generating circuit includes
   a delay circuit for introducing a time delay between said access request signal and said one of said plurality of internal control signals, and
   a logic gate having a first input node supplied with said access request signal and a second input node supplied with said one of said plurality of internal control signals for producing said acknowledge signal.

18. The asynchronous access controller as set forth in claim 17 wherein said logic gate is an AND gate.

19. The asynchronous access controller as set forth in claim 13 wherein said first logic circuit includes
   a first NOR gate shared between said first logic circuit and said second logic circuit and having a first input node supplied with said read-out signal and said write-in signal,
   a second NOR gate having a first input node connected to an output node of said first Muller's c-element and a second input node connected to an output node of said first NOR gate and
   a first NAND gate having a first input node connected to an output node of said second NOR gate and a second input node supplied with said first clock signal,
   said second logic circuit includes
   a third NOR gate having a first input node connected to an output node of said second Muller's c-element and a second input node connected to said output node of said first NOR gate and
   a second NAND gate having a first input node connected to an output node of said second NOR gate and a second input node supplied with said second clock signal, and
   said third logic circuit has a third NAND gate having a first input node connected to an output node of said first NAND gate and a second input node connected to an output node of said second NAND gate.

20. The asynchronous access controller as set forth in claim 19, further comprising an inverter for producing said second clock signal from said first clock signal.

* * * * *